United States Patent [19]
Yamada et al.

[11] Patent Number: 6,033,829
[45] Date of Patent: Mar. 7, 2000

[54] PHOTOPOLYMERIZABLE COMPOSITION AND DRY FILM RESIST

[75] Inventors: Morihiko Yamada; Tsuyoshi Katoh; Katsumi Murofushi, all of Kawasaki, Japan

[73] Assignee: Showa Denko K.K., Tokyo, Japan

[21] Appl. No.: 09/105,147

[22] Filed: Jun. 26, 1998

Related U.S. Application Data

[60] Provisional application No. 60/074,613, Feb. 13, 1998.

[30] Foreign Application Priority Data

Jun. 30, 1997 [JP] Japan .................................. 9-174171

[51] Int. Cl.$^7$ .................................................. G03C 1/725
[52] U.S. Cl. ........................ 430/281.1; 430/910; 430/914
[58] Field of Search ................................ 430/281.1, 320, 430/910, 914, 916, 926

[56] References Cited

U.S. PATENT DOCUMENTS

| | | | |
|---|---|---|---|
| 4,917,977 | 4/1990 | Smothers | 430/1 |
| 4,950,581 | 8/1990 | Koike et al. | 430/281 |
| 4,985,343 | 1/1991 | Kushi et al. | 430/285 |
| 5,143,818 | 9/1992 | Weed et al. | 430/281 |
| 5,200,292 | 4/1993 | Shinozaki et al. | 430/178 |
| 5,346,801 | 9/1994 | Watanabe et al. | 430/253 |
| 5,500,453 | 3/1996 | Toba et al. | 522/25 |
| 5,952,152 | 9/1999 | Cunningham et al. | 430/281.1 |

FOREIGN PATENT DOCUMENTS

| | | |
|---|---|---|
| 0 483 648 A2 | 5/1992 | European Pat. Off. . |
| 2 307 474 | 5/1997 | European Pat. Off. . |
| 64-35548 | 2/1989 | Japan . |
| 1298348 | 12/1989 | Japan . |
| 3126708 | 5/1991 | Japan . |
| 7261407 | 10/1995 | Japan . |
| WO 92/13900 | 8/1992 | WIPO . |

*Primary Examiner*—Janet Baxter
*Assistant Examiner*—Rosemary Ashton
*Attorney, Agent, or Firm*—Sughrue, Mion, Zinn, Macpeak & Seas, PLLC

[57] ABSTRACT

An ultraviolet and/or visible light curing photopolymerizable composition comprising as essential components: (a) a thermoplastic polymer obtained by copolymerization of at least one monomer selected from among α,β-unsaturated carboxyl group-containing monomers and another monomer, (b) a crosslinking monomer with at least two ethylenic unsaturated groups per molecule and (c) an ultraviolet and/or visible light polymerization initiator comprising a quaternary boron salt and a sensitizing dye, as well as a dry film resist containing the composition as its main component.

9 Claims, No Drawings

PHOTOPOLYMERIZABLE COMPOSITION AND DRY FILM RESIST

CROSS REFERENCE TO RELATED APPLICATIONS

This application is an application filed under 35 U.S.C. §111(a) claiming benefit pursuant to 35 U.S.C. §119(e)(1) of the filing date of the Provisional Application 60/074,613, filed Feb. 13, 1998, pursuant to 35 U.S.C. §111(b).

BACKGROUND OF THE INVENTION

1. Field of the Invention

The present invention relates to an ultraviolet and/or visible light curing photopolymerizable composition and a dry film resist and, more specifically, it relates to an ultraviolet and/or visible light curing photopolymerizable composition which can serve as a material for etching or plating resists, solder mask resists, and dry film resists as photosensitive organic films used in the formation of partitions for plasma display panels, and in the production of color filters employed in liquid crystal displays, as well as in the fields of printed circuit board production, metal working and printing plate making; it more particularly relates to an ultraviolet and/or visible light curing photopolymerizable composition which is highly sensitive to ultraviolet light, visible light or light in the wavelength range from ultraviolet light to visible light, and has excellent properties as a resist, as well as to a dry film resist employing it. Here, "ultraviolet light" refers to light of wavelength from 200–400 nm, and visible light is light of wavelength from 400–780 nm.

Ultraviolet and/or visible light sensitivity according to the present invention means both photosensitivity to either ultraviolet or visible light and photosensitivity to both ultraviolet and visible light, while an "ultraviolet and/or visible light curing photopolymerizable composition" means a composition which can be cured by light irradiation in the wavelength range of either ultraviolet or visible light, or both.

2. Description of the Related Art

Recent photoresists widely used for the preparation of printed circuit boards are the so-called "dry film photoresists" which are produced by sandwiching a photopolymerizable resin between a support film and a protective film. The photopolymerizable resin is usually an alkali developing type, with the unexposed portions are removed with an aqueous alkali solution upon development.

The method for using alkali developing dry film resists involves first releasing the protective film from the dry film while thermally laminating the photopolymerizable resin side onto a copper-clad laminate sheet, and then adhering a phototool to the support film side of the resist film and curing the sections to be cured by exposure to ultraviolet light rays or the like. Then, after releasing the support film, the unexposed portions are removed by development with a weak aqueous alkali solution of sodium carbonate or the like, to obtain a circuit pattern in the resist.

When using the copper throughhole method, the copper is subsequently etched, and the cured resist is released with a strong aqueous alkali solution of sodium hydroxide or the like to obtain a printed circuit board. When using the solder throughhole method, after copper plating or solder plating is accomplished the cured resist is released with a strong aqueous alkali solution, and the exposed copper is etched to obtain a printed circuit board.

In the steps described above, the dry film resist must of course have adequate properties as an etching resist, and therefore much research has been carried out in order to improve its resistance.

On the other hand, with recent advances in laser and light-emitting diode scanning exposure technology, a technique known as "direct imaging" has been developed whereby direct scanning exposure is accomplished with a laser or light-emitting diode instead of the conventionally used phototools, and this technique has been applied to plate making and the like.

For this direct imaging technique, methods have been developed for obtaining resist circuit patterns by scanning exposure of dry film resists using a lasers or light-emitting diodes without phototools, but since conventional dry film resists are photosensitive only to ultraviolet light, and their photosensitivity is low, they cannot be used for direct imaging.

It has therefore been desired to develop dry films made of ultraviolet and/or visible light curing photopolymerizable compositions with high sensitivity and scanning exposure ability not only with respect to ultraviolet light but also to visible light, and even to the transmitting wavelength of lasers, especially visible light lasers such as argon lasers with a wavelength of 488 nm and YAG lasers with a wavelength of 532 nm, as well as GaN light-emitting diodes of wavelength 478 nm.

Japanese Unexamined Patent Publication No. 3-126708, for example, describes ultraviolet sensitivity of a crosslinked curable composition comprising a specific thermoplastic polymer and a crosslinking monomer with at least 2 ethylenic unsaturated groups per molecule, but the photosensitivity to lasers and light-emitting diodes is not investigated, nor is any indication given of the visible light photosensitivity. Also, Japanese Unexamined Patent Publication No. 7-261407 describes a method of curing a visible light-curing resist and mentions a number of photopolymerization initiators used in compositions, but the systems do not include organic boron compounds. In addition, Japanese Unexamined Patent Publication No. 1-35548 and No. 1-298348 disclose photopolymerizable compositions containing photopolymerizable compounds with ethylenic unsaturated groups and linear organic polymers which also contain organic cationic dyes and organic boron compounds, but, in order to exhibit their effect, it has been necessary to further include a photopolymerization initiating triazine compound or morpholine compound.

SUMMARY OF THE INVENTION

It is an object of the present invention, therefore, to provide a photocuring photopolymerizable composition which has high photosensitivity to ultraviolet and/or visible light and excellent properties as a resist, as well as a dry film resist employing it.

As a result of diligent research aimed at achieving the aforementioned object, the present inventors have completed the present invention upon the finding that high sensitivity to ultraviolet and/or visible light rays is exhibited, and excellent properties as a resist are achieved, by an ultraviolet and/or visible light curing photopolymerizable composition comprising as essential components:

(a) a thermoplastic polymer obtained by copolymerization of at least one α,β-unsaturated carboxyl group-containing monomer (a-1) and another monomer (a-2), (b) a crosslinking monomer with or more ethylenic unsaturated groups per molecule and (c) an ultraviolet and/or visible light photopolymerization initiator, in which the photopolymerization initiator (c) comprises a compound (c-1) represented by formula (1) given below and a sensitizing dye (c-2).

Specifically, the present invention provides a photocuring photopolymerizable composition comprising as essential components (a) a thermoplastic polymer obtained by copolymerization of at least one monomer selected from among α,β-unsaturated carboxyl group-containing monomers, and another monomer, (b) a crosslinking monomer with 2 or more ethylenic unsaturated groups per molecule and (c) an ultraviolet and/or visible light-sensitive photopolymerization initiator, in which the ultraviolet and/or visible light photopolymerization initiator comprises a compound represented by formula (1) below and a sensitizing dye.

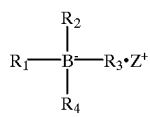

(1)

wherein $R_1$, $R_2$, $R_3$ and $R_4$ may be the same or different and each independently represents an alkyl, alkenyl, aryl, aralkyl, heterocyclic or alicyclic group, and $Z^+$ represents a quaternary ammonium cation, quaternary pyridinium cation, quaternary quinolinium cation, phosphonium cation, sulfonium cation, oxonium cation, iodonium cation or metal cation.

DESCRIPTION OF THE PREFERRED EMBODIMENTS

The thermoplastic polymer (a) in the photopolymerizable composition of the invention is obtained by copolymerization of at least one α,β-unsaturated carboxyl group-containing monomer (a-1) having preferably 3–15 carbon atoms, with another monomer (a-2), to allow its development in an aqueous alkali solution of sodium carbonate or the like.

As examples of specific α,β-unsaturated carboxyl group-containing monomers (a-1) suitable for use there may be mentioned acrylic acid, methacrylic acid, cinnamic acid, crotonic acid, sorbic acid, itaconic acid, propiolic acid, maleic acid and fumaric acid. Their half esters or anhydrides may also be used.

The α,β-unsaturated carboxyl group-containing monomer (a-1) component is preferably present in the thermoplastic polymer (a) at a content of 15–30 wt % and the other monomer (a-2) at 85–70 wt %, or more preferably the α,β-unsaturated carboxyl group-containing monomer (a-1) is in the range of 15–25 wt % and the other monomer (a-2) in the range of 85–75 wt %. If the content of the α,β-unsaturated carboxyl group-containing monomer (a-1) in the thermoplastic polymer (a) is less than 15 wt %, development in aqueous alkali solutions may not be possible, or too much time may be required for development thus lowering the productivity. On the other hand, if the content of the α,β-unsaturated carboxyl group-containing monomer (a-1) exceeds 30 wt %, the developing time may be too short thus rendering development control more difficult for high resolution patterns, while the moisture resistance of the curing sections may also be lowered.

Preferred for use as the other monomer (a-2) in the thermoplastic polymer (a) are one or more polymerizable components selected from among the polymerizable component (a-2-1), polymerizable component (a-2-2) and polymerizable component (a-2-3) indicated below, and more preferably the three types of polymerizable components (a-2-1), (a-2-2) and (a-2-3) may be used together with the α,β-unsaturated carboxyl group-containing monomer (a-1).

Preferred as the polymerizable component (a-2-1) are polymerizable components selected from the group consisting of compounds represented by general formula (3) below and their ring-substituted derivatives.

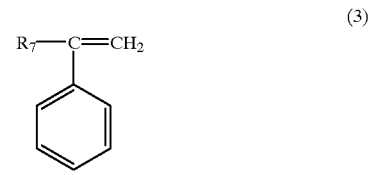

(3)

wherein $R_7$ is hydrogen, an alkyl group having 1–6 carbon atoms, or a halogen atom.

The benzene ring of the compound represented by general formula (3) may be substituted with a functional group such as an alkyl, nitro, alkoxy or acyl group or a halogen, with benzene ring alkyl substituents including methyl, tert-butyl and the like. Among these compounds, styrene is the most preferred.

The content of the polymerizable component (a-2-1) in the thermoplastic polymer (a) obtained using the 3 polymerizable components (a-2-1), (a-2-2) and (a-2-3) copolymerized together with the α,β-unsaturated carboxyl group-containing monomer (a-1) is preferably in the range of 2–25 wt %. If the content of the polymerizable component (a-2-1) is less than 2 wt % it may be difficult to obtain a resist material with excellent chemical resistance, and especially plating resistance, while if the content exceeds 25 wt % the resist resin layer of the resulting dry film resist may be too hard, and the plate-like resist tends to peel.

Preferred for use as the polymerizable component (a-2-2) are alkyl acrylates with alkyl groups of 1–8 carbon atoms and hydroxyalkyl acrylates with hydroxyalkyl groups of 2–8 carbon atoms.

As specific examples for the polymerizable component (a-2-2) there may be mentioned methyl acrylate, ethyl acrylate, n-propyl acrylate, isopropyl acrylate, n-butyl acrylate, sec-butyl acrylate, tert-butyl acrylate, 2-hydroxyethyl acrylate, 2-hydroxypropyl acrylate and 2-ethylhexyl acrylate.

Most preferred among these compounds for the polymerizable component (a-2-2) are methyl acrylate, ethyl acrylate, n-butyl acrylate and 2-ethylhexyl acrylate.

The content of the polymerizable component (a-2-2) in the thermoplastic polymer (a) obtained using the 3 polymerizable components (a-2-1), (a-2-2) and (a-2-3) copolymerized together with the α,β-unsaturated carboxyl group-containing monomer (a-1) is preferably in the range of 10–40 wt %, considering the aspect of achieving adequate plasticity for the photopolymerizable composition of the invention.

If the content of the polymerizable component (a-2-2) is less than 10 wt % it may be difficult to obtain a dry film resist with sufficient plasticity, while the adhesion to substrates and the ability of the resist resin to fill in the pits of substrate surfaces may be inadequate, and the plating resistance of the resist may thus be lowered. On the other hand, if the content exceeds 40 wt % the resist resin will instead be too soft, so that when the resulting dry film resist is stored as a wound roll, the resist resin tends to ooze out from between the support film with time, resulting in the "cold flow" phenomenon.

Preferred for use as the polymerizable component (a-2-3) are alkyl methacrylates with alkyl groups of 1–8 carbon atoms and hydroxyalkyl methacrylates with hydroxyalkyl groups of 2–8 carbon atoms.

As specific examples for the polymerizable component (a-2-3) there may be mentioned methyl methacrylate, ethyl methacrylate, n-propyl methacrylate, isopropyl methacrylate, n-butyl methacrylate, sec-butyl methacrylate, tert-butyl methacrylate, 2-hydroxyethyl methacrylate, 2-hydroxypropyl methacrylate and 2-ethylhexyl methacrylate.

Methyl methacrylate is most preferred among these compounds for the polymerizable component (a-2-3).

The polymerizable component (a-2-3) is copolymerized with the alkyl acrylate or hydroxy acrylate of the polymerizable component (a-2-2) to provide a suitable crystallization temperature for the thermoplastic polymer (a), and the content of the polymerizable component (a-2-3) in the thermoplastic polymer (a) obtained using the 3 polymerizable components (a-2-1), (a-2-2) and (a-2-3) copolymerized together with the α,β-unsaturated carboxyl group-containing monomer (a-1) is preferably in the range of 30–65 wt %.

The weight average molecular weight of the thermoplastic polymer (a) used according to the invention is preferably in the range of 40,000 to 500,000. Polymers of weight average molecular weight less than 40,000 tend to produce a cold flow phenomenon when made into dry film resists, whereas those of weight average molecular weight greater than 500,000 may have insufficient solubility of the unexposed portions in alkali developing solutions, which results in a poor developing property with a much longer development time, and consequently lower resolution and lower productivity for circuit patterns.

The thermoplastic polymer (a) used according to the invention is preferably added at 40–70 wt %, and more preferably 50–70 wt %, with respect to the photopolymerizable composition of the invention.

Photopolymerizable compositions with less than a 40 wt % content of the thermoplastic polymer (a) may have stronger adhesion as dry film resists and poorer handling because of their adhesion to substrates at room temperature even without pressure, while their film formability may be poor and cold flow tends to occur due to insufficient film strength. On the other hand, if the content of the thermoplastic polymer (a) exceeds 70 wt %, the adhesion of the resulting dry film resist may be lowered, so that complete adhesion cannot be achieved even after lamination, while the photocured film may be brittle thus impairing the adhesive strength with substrates, and making it impossible to obtain sufficient chemical resistance, especially plating resistance and etching resistance.

The crosslinking monomer (b) having at least 2 ethylenic unsaturated groups per molecule, as a structural component of the ultraviolet and/or visible light curing photopolymerizable composition of the invention, is preferably a compound represented by general formula (4) below and/or a compound represented by general formula (5) below.

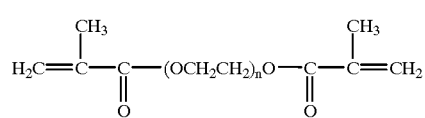

(4)

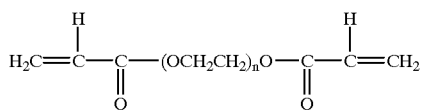

(5)

The content of the compound represented by general formula (4) in the crosslinking monomer (b) is preferably from 15 wt % to 100 wt %, and more preferably 20–40 wt %. The content of the compound represented by general formula (5) is preferably from 5 wt % to 85 wt %, and more preferably 20–60 wt %.

The content of the crosslinking monomer (b) as a structural component of the ultraviolet and/or visible light curing photopolymerizable composition of the invention is preferably 25–50 wt %, and more preferably 30–45 wt %, with respect to the photopolymerizable composition of the invention. If the content of the crosslinking monomer (b) is less than 25 wt %, the photopolymerizable composition of the invention may not sufficiently harden under ultraviolet light and/or visible light, while the chemical resistance may be lower, and swelling may occur during the development process, resulting in inadequate development. Conversely, when a dry film resist is made with a crosslinking monomer (b) content of greater than 50 wt %, cold flow tends to occur and the peeling property of the cured product in aqueous alkali solutions may be inferior.

It is even more preferred for the content of the crosslinking monomer (b) to be at least 65 wt % with respect to the thermoplastic polymer (a). When the content of the crosslinking monomer (b) is less than 65 wt %, the dry film resist may have lower photosensitivity to visible light.

The crosslinking monomer (b) is not particularly restricted so long as it is a compound with at least 2 ethylenic unsaturated groups per molecule. As specific examples there may be mentioned (meth)acrylates of polyhydric alcohols, such as bisphenol A di(meth)acrylate, polyethylene glycol di(meth)acrylate, 1,4-butanediol di(meth)acrylate, dicyclopentanyl di(meth)acrylate, 1,6-hexanediol di(meth)acrylate, neopentylglycol di(meth)acrylate, 2,2-bis-[4-(meth) acryloxypolyethoxyphenyl] propane, 2,2-bis-[4-(meth) acryloxypolypropyleneoxyphenyl] propane, hydroxypivalic neopentylglycol di(meth)acrylate, glycerin di(meth) acrylate, glycerin tri(meth)acrylate, trimethylolethane di(meth)acrylate, trimethylolpropane di(meth)acrylate, trimethylolpropane tri(meth)acrylate, trimethylolpropane tris [polyethoxy (meth)acrylate], trimethylolpropane tris [polypropyleneoxy (meth)acrylate], tris[(meth) acryloxyethyl] isocyanurate, pentaerythritol di(meth) acrylate, pentaerythritol tri(meth)acrylate, pentaerythritol tetra(meth)acrylate, dipentaerythritol tri(meth)acrylate, dipenterythritol tetra(meth)acrylate, dipentaerythritol penta (meth)acrylate, dipentaerythritol hexa(meth)acrylate, compounds of general formula (4) or (5) above where n=1–3, and compounds of general formula (4) or (5) above where n=10 or greater, as well as epoxy (meth)acrylates and urethane (meth)acrylates.

Incidentally, "(meth)acrylate" used here means either "acrylate" or "methacrylate".

The ultraviolet and/or visible light sensitive photopolymerization initiator (c) component of the photopolymerizable composition of the invention comprises a compound (c-1) represented by general formula (1) above and a sensitizing dye (c-2). Combination of a compound (c-1) represented by general formula (1) with a suitable sensitizing dye (c-2) causes decomposition of the initiator upon light irradiation, thus initiating the polymerization.

$R_1$, $R_2$, $R_3$ and $R_4$ in general formula (1) above may be the same or different, and each independently represents an alkyl, alkenyl, aryl, aralkyl, heterocyclic or alicyclic group.

Preferred as alkyl groups are substituted or non-substituted linear or branched alkyl groups of 1 to 10 carbon atoms, among which there may be specifically mentioned methyl, ethyl, propyl, isopropyl, butyl, isobutyl, sec-butyl, pentyl, hexyl, heptyl, octyl, 3-methoxypropyl, 4-chlorobutyl and 2-diethylaminoethyl.

Preferred as alkenyl groups are substituted or non-substituted alkenyl groups of 2 to 12 carbon atoms, among which there may be specifically mentioned vinyl, propenyl, butenyl, pentenyl, hexenyl, heptenyl, octenyl, dodecenyl and prenyl.

The aryl groups may be substituted or non-substituted aryl groups, among which there may be specifically mentioned phenyl, tolyl, xylyl, 4-ethylphenyl, 4-butylphenyl, 4-tert-butylphenyl, 4-methoxyphenyl, 4-diethylaminophenyl, 2-methylphenyl, 2-methoxyphenyl, 1-naphthyl, 2-naphthyl, 6-methoxy-2-naphthyl, 4-methyl-1-naphthyl, phenanthryl and anthryl.

The aralkyl groups may be substituted or non-substituted aralkyl groups, among which there may be specifically mentioned benzyl, phenethyl, propiophenyl, 1-naphthylmethyl, 2-naphthylmethyl and 4-methoxybenzyl.

The heterocyclic groups may be substituted or non-substituted heterocyclic groups, among which there may be specifically mentioned pyridyl, quinolyl, methylpyridyl and indolyl.

The alicyclic groups may be substituted or non-substituted alicyclic groups, among which there may be specifically mentioned cyclohexyl, 4-methylcyclohexyl, cyclopentyl and cycloheptyl.

As the cationic portion $Z^+$ of the compound (c-1) represented by general formula (1) above there may be specifically mentioned quaternary ammonium cation, quaternary pyridinium cation, quaternary quinolinium cation, phosphonium cation, sulfonium cation, oxonium cation, sodium, potassium, lithium, magnesium, calcium, and other metal cations.

As specific examples of the compound (c-1) represented by general formula (1) above there may be mentioned:
tetramethylammonium ethyltributylborate,
tetra-n-butylammonium phenethyltrimethylborate,
tetraethylammonium phenyltriisobutylborate,
tetra-n-butylammonium phenethyltri(4-methylphenyl)borate,
tetramethylammonium ethyltriphenylborate,
(2-hydroxyethyl)trimethylammonium n-butyltri(4-methylphenyl)borate,
tetraethylammonium n-octyltri(4,5-diethylphenyl)borate,
tetra-n-butylammonium n-pentyltri(4-methoxyphenyl)borate,
tetra-n-butylammonium n-butyltri(6-methoxy-2-naphthyl)borate,
(2-hydroxyethyl)trimethylammonium methyltri(1-naphthyl)borate,
(2-hydroxyethyl)trimethylammonium n-butyltri(6-methoxy-2-naphthyl)borate,
pyridinium n-butyltrinaphthylborate,
diphenyliodonium n-butyltri(4-methylnaphthyl)borate,
triethylsulfonium n-octyltri(4,5-diethylnaphthyl)borate and sodium ethyltriacenaphthylborate,
any of which may be used alone or in combinations of 2 or more.

From the standpoint of photosensitivity, thermal stability and the intensity of the absorption wavelength of the ultra-violet and/or visible light range, it is especially preferred to use an ultraviolet and/or visible light sensitive photopolymerization initiator comprising, particularly, a compound represented by general formula (2) above among the compounds (c-1) represented by general formula (1), and a suitable sensitizing dye (c-2); remarkably high photosensitivity to ultraviolet light and/or visible light is exhibited by using a composition which is a combination of the aforementioned thermoplastic polymer (a) with the crosslinking monomer (b) having at least 2 ethylenic unsaturated groups per molecule.

The ultraviolet and/or visible light sensitive photopolymerization initiator in the composition of the invention preferably comprises a compound represented by general formula (2) below with a sensitizing dye.

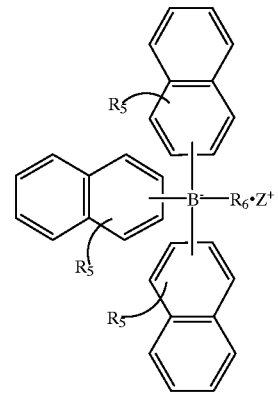

(2)

wherein $R_5$ and $R_6$ may be the same or different and each independently represents hydrogen or an alkyl, alkenyl, alkoxyl, aryl, aralkyl, heterocyclic or alicyclic group, $R_5$ may be at any positions on the naphthalene rings, and $Z^+$ represents a quaternary ammonium cation, quaternary pyridinium cation, quaternary quinolinium cation, phosphonium cation, sulfonium cation, oxonium cation, iodonium cation or metal cation.

Preferred as alkyl groups in general formula (2) above are substituted or non-substituted linear or branched alkyl groups of 1 to 10 carbon atoms, among which there may be specifically mentioned methyl, ethyl, propyl, isopropyl, butyl, isobutyl, sec-butyl, pentyl, hexyl, heptyl, octyl, 3-methoxypropyl, 4-chlorobutyl and 2-diethylaminoethyl.

The alkenyl groups may be substituted or non-substituted alkenyl groups of 2 to 12 carbon atoms, among which there may be specifically mentioned vinyl, propenyl, butenyl, pentenyl, hexenyl, heptenyl, octenyl, dodecenyl and prenyl.

Preferred as alkoxyl groups are substituted or non-substituted linear or branched alkoxyl groups of 1 to 10 carbon atoms, among which there may be specifically mentioned methoxy, ethoxy, propoxy, isopropoxy, butoxy, isobutoxy, sec-butoxy, pentyloxy, hexyloxy, tert-butoxy, 2-methoxypropoxy and 3-diethylaminobutoxy.

The aryl groups may be substituted or non-substituted aryl groups, among which there may be specifically mentioned phenyl, tolyl, xylyl, 4-ethylphenyl, 4-butylphenyl, 4-tert-butylphenyl, 4-methoxyphenyl, 4-diethylaminophenyl, 2-methylphenyl, 2-methoxyphenyl, naphthyl and 4-methylnaphthyl.

The aralkyl groups may be substituted or non-substituted aralkyl groups, among which there may be specifically mentioned benzyl, phenethyl, propiophenyl, 1-naphthylmethyl, 2-naphthylmethyl and 4-methoxybenzyl.

The heterocyclic groups may be substituted or non-substituted heterocyclic groups, among which there may be specifically mentioned pyridyl, quinolyl, methylpyridyl and indolyl.

The alicyclic groups may be substituted or non-substituted alicyclic groups, among which there may be specifically mentioned cyclohexyl, 4-methylcyclohexyl, cyclopentyl and cycloheptyl.

As suitable sensitizing dyes (c-2) used according to the invention there may be mentioned cationic dyes such as cyanine, xanthene, oxazine, thiazine, diarylmethane, triarylmethane and pyrylium, or electrically neutral dyes, i.e. organic dyes without counter ions but having + and − in the same molecule due to resonance, such types include merocyanine, coumarin, indigo, aromatic amine, phthalocyanine, azo and quinone dyes.

The counter anion for a cationic dye may be any desired anion, for example a halogen anion such as chloride, bromide or iodide anion, or benzenesulfonate anion, p-toluenesulfonate anion, methanesulfonate anion, $PF_6$ anion or an organic boron anion.

As specific examples of the sensitizing dye (c-2) there may be mentioned crystal violet (C.I.42555), methyl violet (C.I.42535), malachite green (C.I.42000), fuchsin (C.I.42510), crystal violet-carbinol base (C.I.42555:1), parafuchsin (C.I.42500), rhodamin B (C.I.45170), victoria blue B (C.I.44045), victoria pure blue BOH (C.I.42595), brilliant green (C.I.42040), night blue BX (C.I.51185), neutral red (C.I.50040), safranine O (C.I.50240), basic orange 21 (C.I.48035), basic orange 22, basic yellow 11, basic yellow 22, basic yellow 36, basic red 1 (C.I.45160), basic red 5 (C.I.50040), basic red 13 (C.I.48015), basic red 14, basic violet 7 (C.I.48020), basic violet 11 (C.I.45175), p-toluenesulfonate or naphthalenesulfonate salts of crystal violet; p-toluenesulfonate salts, tetrafluoroboron salts or tetraphenylboron salts of victoria blue B; p-toluenesulfonate salts, tetrafluoroboron salts or tetraphenylboron salts of basic orange 21; naphthalenesulfonate salts, tetrafluoroboron salts or tetraphenylboron salts of basic red 5; and 3-allyl-1-carboxymethyl-5-[2-(3-ethyl-2(3H) benzoxazolylidene]-2-thiohydantoin, 4-[2-(3-ethyl-2(3H) benzothiazolylidene) ethylidene]-3-phenyl-2-isoxazolin-5-one, 3-(2-benzothiazoline)-7-(diethylamino) coumarin, 3-(2-benzimidazolyl)-7-(diethylamino) coumarin, ethyl 2,3,6,7-tetrahydro-11-oxo-1H,5H,11H-[1] benzopyrano [6,7,8-ij] quinolidine-10-carboxylate, N,N'-diethylindigo, thioxoindigo, 2-dimethylaminoanthraquinone, 4-hydroxyazobenzene and 4-phenylamino-4'-nitroazobenzene.

These sensitizing dyes (c-2) may be used in mixtures of 2 or more as necessary.

The sensitizing dye (c-2) may be present in the photopolymerizable composition of the invention in any desired content, but preferably at 0.01–5 wt % with respect to the photopolymerizable composition of the invention.

The amount of the photopolymerization initiator (c) contained in the photopolymerizable composition of the invention is preferably 0.1–10 wt %, and more preferably 0.3–5 wt % with respect to photopolymerizable composition of the invention. Compositions with less than a 0.1 wt % content of the photopolymerization initiator (c) may have lower photosensitivity. On the other hand, there is usually no improvement in the photosensitivity even when the content of the photopolymerization initiator (c) exceeds 10 wt %, and this is not only economically undesirable but can also result in lower physical properties of the cured resist.

Also, the mixing ratio of the compound (c-1) represented by general formula (1) and the sensitizing dye (c-2) is preferably determined within a range such that in terms of weight ratio, the compound (c-1) represented by general formula (1)/sensitizing dye (c-2)=0.01–100. If the proportion of these 2 compounds used is less than 0.01 the photosensitivity may be lower, while even at greater than 100 there is often no improvement in the photosensitivity.

If necessary, for increased performance of the photopolymerization initiator (c) there may be added to the photopolymerization initiator a chain transfer agent comprising an active hydrogen donor, for example an N-phenylglycine based compound such as N-phenylglycine or N-p-hydroxyphenylglycine, or phenoxyacetic acid, trimethylbarbituric acid, 2-mercaptobenzimidazol, 2-mercaptobenzothiazole, 2-mercaptobenzoxazole, N,N-dialkylbenzoic alkyl ester or N,N-dialkylaniline.

The ultraviolet and/or visible light curing photopolymerizable composition of the invention contains the essential components described above, i.e. the thermoplastic polymer (a), the crosslinking monomer with 2 or more ethylenic unsaturated groups per molecule (b) and the ultraviolet and/or visible light sensitive photopolymerization initiator (c), but if further required it may also contain other additives.

The additives may be any of a variety of additives for improved plating resistance, such as adhesion promoters, polymerization inhibitors, fillers and plasticizers.

As adhesion promoters there are specifically preferred tetrazoles and their derivatives, which can provide better adhesion to metal surfaces in small amounts, and examples thereof include 1-phenyltetrazole, 5-aminotetrazole, 1-amino-1-methyltetrazole, 5-amino-2-phenyltetrazole and 5-mercapto-1-phenyltetrazole. These may be used alone or in combinations of 2 or more.

For formation of a dry film using the photopolymerizable composition of the invention, the application may be made using a blade coater, rod coater, knife coater, rolled coater, roll doctor coater, transfer rolled coater, gravure coater, kiss-roll coater or curtain coater, and when a solvent is used in the photopolymerizable composition of the invention the solvent must be evaporated off.

A polyester or other type of plastic film is generally used as the support for the photopolymerizable composition of the invention. The drier used may be one equipped with a heating source based on a steam air heating system, from the standpoint of safety when a solvent is used, and the dried resist may be laminated with a protective film of polyethylene or polypropylene if necessary.

The dry film resist produced in this manner can be cured with a light source such as ultraviolet rays or a mercury vapor lamp, metal halide lamp or xenon lamp, but since the photopolymerizable composition of the invention is characterized by having high photosensitivity to the emission wavelength of visible light lasers such as argon lasers with a wavelength of 488 nm and YAG lasers with a wavelength of 532 nm, and to GaN light-emitting diodes of wavelength 478 nm, it is preferred to use such visible light lasers such as argon lasers and YAG lasers and light-emitting diodes such as GaN for the scanning exposure.

The present invention will now be further explained by way of examples, with the understanding that the invention is in no way limited by these examples.

EXAMPLES 1–17

One of the following resins A, B or C was used as the thermoplastic polymer (a), tetraethylene glycol diacrylate, tetraethylene glycol dimethacrylate or trimethylolpropane triacrylate was used as the crosslinking monomer (b), and one of the photopolymerizable initiators (1) to (7) listed below was used as the ultraviolet and/or visible light sensitive photopolymerization initiator (c), to prepare solutions of ultraviolet and/or visible light curing photopolymerizable compositions according to the invention, having the compositions (wt %) listed in Table 1.

Each of the resulting photopolymerizable composition solutions of the invention was coated onto a polyester film of a thickness of 25 μm using a blade coater, and then dried in a drier at 50° C. to obtain a photopolymerizable composition layer (photosensitive layer) according to the invention with a thickness of 30 μm. This was then laminated with a polyethylene film of a thickness of 30 μm as a protective film.

Each resulting dry film resist was heat laminated onto a copper-clad laminate sheet while releasing the protective film, to make a test panel.

The sensitivity (mJ/cm$^2$) of each test panel was determined by measurement of the scanning exposure sensitivity of according to the following method. The results are shown in Table 2.

The sensitivity (level) of each test panel was determined by measurement of the ultraviolet sensitivity according to the following method. The results are shown in Table 3.

Monomer compositional ratio (weight ratio) of thermoplastic polymers (a):

Resin A: methacrylic acid/styrene/methyl acrylate/methyl methacrylate=20.0/5.0/22.5/52.5

Resin B: maleic acid/styrene/methyl acrylate/methyl methacrylate=22.5/5.0/22.5/50.0

Resin C: methacrylic acid/styrene/methyl acrylate/2-ethylhexyl methacrylate=22.5/5.0/22.5/50.0

Ultraviolet and/or visible light curing photopolymerization initiators (c):

Initiator 1: tetra-n-butylammonium butyltriphenylborate/1,3,3-trimethyl-2-[2-(1-methyl-2-phenyl-3-indolyl) vinyl]-3H-indolium tetraphenylborate=4/1 (wt/wt)

Initiator 2: tetra-n-butylammonium butyltritolylborate/Basic Yellow 36=4/1 (wt/wt)

Initiator 3: tetra-n-butylammonium butyltri(1-naphthyl)borate/Basic Orange 22=4/1 (wt/wt)

Initiator 4: tetra-n-butylammonium butyltri(4-methyl-1-naphthyl)borate/1,3,3-trimethyl-2-[2-(1-methyl-2-phenyl-3-indolyl) vinyl]-3H-indolium tetraphenylborate/1,3,3-trimethyl-2-[2-(2,3-methoxy-1-anilino) vinyl]-3H-indolium tetraphenylborate=4/1/1 (wt/wt/wt)

Initiator 5: tetra-n-butylammonium butyltriphenylborate/Basic Red 1=3/1 (wt/wt)

Initiator 6: tetra-n-butylammonium butyltri(1-naphthyl)borate/3,7-diamino-2,8-dimethyl-5-phenylphenazinium tetrafluoroborate=3/1 (wt/wt)

Initiator 7: tetra-n-butylammonium butyltri(4-methyl-1-naphthyl)borate/Basic Red 14=3/1 (wt/wt)

Method of Measuring Scanning Exposure Sensitivity

The 488 nm output of an argon laser (GLG3028) by NEC Corp. as the light source with the beam radius of the laser light focused to 3.5 mm through an optical system, or the 532 nm output of a YAG laser (4301-100) by Uniphase Ltd. as the light source with the laser light at a beam diameter of 0.2 mm, was used for scanning exposure of each of the prepared test panels to draw a line-and-space pattern of 20 or 2 mm, and the panels were allowed to stand for 30 minutes.

After releasing the polyester film, a 1% aqueous solution of sodium carbonate was used for dissolution and removal of the uncured portions to obtain a scanning exposure pattern. The spray pressure was 1.4 kg/cm$^2$, the distance between spray and panel was 10 cm, and the treatment was carried out for 40 seconds at a temperature of 30° C. The scanning exposure speed was incrementally varied while measuring the line width of the cured portion of the scanning pattern, and the irradiation energy per unit area was calculated at the scanning exposure speed which gave the same line width as the scanning line width, to thus determine the sensitivity.

Method of Measuring Ultraviolet Sensitivity

A step tablet gray scale manufactured by Eastman Kodak Co. was mounted on each of the prepared test panels, for light exposure using an ultra high-pressure mercury lamp (USH-200DP) by Ushio Inc. The polyester film was peeled off, and the exposed side was contacted with a coating sheet and transferred with a calender roll. The sensitivity was read as the number of rows in which an image was formed with minimum exposure from the obtained image.

TABLE 1

| Component | | Example | | | | | | | | | |
|---|---|---|---|---|---|---|---|---|---|---|---|
| | | 1 | 2 | 3 | 4 | 5 | 6 | 7 | 8 | 9 | 10 |
| Thermo-plastic polymer | Resin A | 60.5 | 60.5 | 60.5 | 60.5 | 60.5 | | | | | |
| | Resin B | | | | | | 60.5 | 60.5 | 60.5 | 60.5 | |
| | Resin C | | | | | | | | | | 60.5 |
| Cross-linking monomer | tetraethylene glycol diacrylate | 19.25 | 17.9 | 17.9 | 17.9 | 17.9 | 17.9 | 17.9 | 17.9 | 17.9 | 17.9 |
| | tetraethylene glycol dimethacrylate | 19.25 | 17.9 | 17.9 | 17.9 | 17.9 | 17.9 | 17.9 | 17.9 | 17.9 | 17.9 |
| | trimethylolpropane triacrylate | | 2.7 | 2.7 | 2.7 | 2.7 | 2.7 | 2.7 | 2.7 | 2.7 | 2.7 |
| Initiator | 1 | | | 1.0 | | | 1.0 | | | | |
| | 2 | | | | 1.0 | | | 1.0 | | | |
| | 3 | 1.0 | 1.0 | | | | | | 1.0 | | |
| | 4 | | | | | 1.0 | | | | 1.0 | 1.0 |

| Component | | Example | | | | | |
|---|---|---|---|---|---|---|---|
| | | 11 | 12 | 13 | 14 | 15 | 16 | 17 |
| Thermo-plastic | Resin A | 60.5 | | | | | | |
| | Resin B | | 60.5 | 60.5 | 60.5 | | | |

TABLE 1-continued

| | | | | | | | | | |
|---|---|---|---|---|---|---|---|---|---|
| polymer | Resin C | | | | | 60.5 | 60.5 | 60.5 | |
| Cross-linking monomer | tetraethylene glycol diacrylate | 17.9 | 17.9 | 17.9 | 17.9 | 17.9 | 17.9 | 17.9 |
| | tetraethylene glycol dimethacrylate | 17.9 | 17.9 | 17.9 | 17.9 | 17.9 | 17.9 | 17.9 |
| | trimethylolpropane triacrylate | 2.7 | 2.7 | 2.7 | 2.7 | 2.7 | 2.7 | 2.7 |
| Initiator | 5 | 1.0 | 1.0 | | | 1.0 | | |
| | 6 | | | 1.0 | | | 1.0 | |
| | 7 | | | | 1.0 | | | 1.0 |

TABLE 2

| | Example | | | | | | | | | | | | | | | | |
|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 |
| Sensitivity (mJ/cm$^2$) | 6 | 5 | 20 | 10 | 2 | 20 | 10 | 5 | 5 | 2 | 5 | 6 | 1 | 0.8 | 5 | 1 | 0.6 |

TABLE 3

| | Example | | | | | | | | | | | | | | | | |
|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 |
| Sensitivity (level) | 12 | 13 | 4 | 10 | 18 | 5 | 11 | 14 | 20 | 19 | 13 | 14 | 19 | 25 | 14 | 20 | 25 |

The results shown in Table 2 (Examples 1–10 are results with an argon laser, and Examples 11–17 are results with a YAG laser) and Table 3 confirm that the use of ultraviolet and/or visible light curing photopolymerizable compositions according to the invention (Examples 1–17) can give dry film resists with high sensitivity to ultraviolet and/or visible light.

Furthermore, dry films with particularly high photosensitivity were obtained in the case of Examples 5, 9 and 10 and Examples 14 and 17 which employed initiators comprising compounds represented by general formula (2) and appropriate sensitizing agents (initiators 4 and 7).

An ultraviolet and/or visible light curing photopolymerizable composition according to the present invention has high photosensitivity to ultraviolet or visible light rays, and exhibits excellent properties as a resist.

Dry film resists obtained using ultraviolet and/or visible light curing photopolymerizable compositions according to the invention can be cured with light sources such as ultraviolet rays, mercury vapor lamps, metal halide lamps and xenon lamps, and because they have high photosensitivity to the transmitting wavelengths of visible lasers such as argon lasers and YAG lasers, as well as light-emitting diodes such as GaN light-emitting diodes, they can be used for high speed scanning exposure.

We claim:

1. An ultraviolet and/or visible light curing photopolymerizable composition comprising: (a) a thermoplastic polymer obtained by copolymerization of at least one monomer selected from the group consisting of α,β-unsaturated carboxyl group-containing monomers with at least one monomer selected from the group consisting of compounds represented by formula (3) below

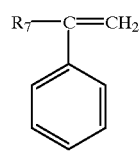

(3)

wherein $R_7$ is hydrogen, an alkyl group having 1–6 carbon atoms or a halogen atom, and their ring-substituted derivatives, at least one monomer selected from the group consisting of alkyl acrylates with alkyl groups of 1–8 carbon atoms and hydroxyalkyl acrylates with hydroxyalkyl groups of 2–8 carbon atoms, and at least one monomer selected from the group consisting of alkyl methacrylates with alkyl groups of 1–8 carbon atoms and hydroxyalkyl methacrylates with hydroxyalkyl groups of 2–8 carbon atoms, (b) a crosslinking monomer with 2 or more ethylenic unsaturated groups per molecule and (c) an ultraviolet and/or visible light sensitive photopolymerization initiator, in which said ultraviolet and/or visible light sensitive photopolymerization initiator comprises a compound represented by formula (1) below and a cationic dye or an electrically neutral dye

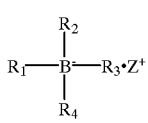

(1)

wherein $R_1$, $R_2$, $R_3$ and $R_4$ may be the same or different, and each independently represents an alkyl, alkenyl, aryl, aralkyl, heterocyclic or alicyclic group, and $Z^+$ represents a quaternary ammonium cation, quaternary pyridinium cation, quaternary quinolinium cation, phosphonium cation, sulfonium cation, oxonium cation, iodonium cation or metal cation.

2. A composition according to claim 1, wherein the α,β-unsaturated carboxyl group-containing monomer is a monomer with 3–15 carbon atoms.

3. A composition according to claim 1, wherein the thermoplastic polymer is a thermoplastic polymer obtained by copolymerization of 15–30 wt % of one or more compounds selected from among α,β-unsaturated carboxy group-containing monomers and 85–70 wt % of the combination of at least one monomer selected from the group consisting of compounds represented by formula (3) below

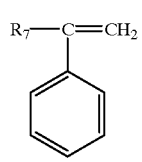

(3)

wherein $R_7$ is hydrogen, an alkyl group having 1–6 carbon atoms or a halogen atom, and their ring-substituted derivatives, at least one monomer selected from the group consisting of alkyl acrylates with alkyl groups of 1–8 carbon atoms and hydroxyalkyl acrylates with hydroxyalkyl groups of 2–8 carbon atoms, and at least one monomer selected from the group consisting of alkyl methacrylates with alkyl groups of 1–8 carbon atoms and hydroxyalkyl methacrylates with hydroxyalkyl groups of 2–8 carbon atoms.

4. A composition according to claim 1, which contains (a) 40–70 wt % of the thermoplastic polymer, (b) 25–50 wt % of the crosslinking monomer and (c) 0.1–10 wt % of the ultraviolet and/or visible light sensitive photopolymerizable initiator.

5. A composition according to claim 4, wherein the content of the crosslinking monomer is at least 65 wt % with respect to the thermoplastic polymer.

6. A composition according to claim 1, wherein the ultraviolet and/or visible light sensitive photopolymerizable initiator comprises a compound represented by general formula (2) below and a cationic dye or an electrically neutral dye

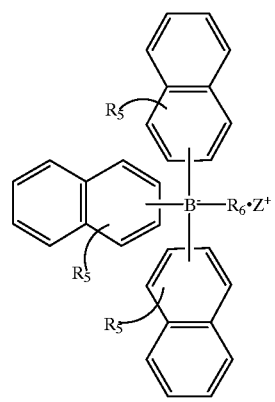

(2)

wherein $R_5$ and $R_6$ may be the same or different and each independently represents hydrogen or an alkyl, alkenyl, alkoxyl, aryl, aralkyl, heterocyclic or alicyclic group, $R_5$ may be at any positions on the naphthalene rings, and $Z^+$ represents a quaternary ammonium cation, a quaternary pyridinium cation, a quaternary quinolinium cation, a phosphonium cation, a sulfonium cation, an oxonium cation, an iodonium cation or a metal cation.

7. A composition according to claim 1, wherein a chain transfer agent is added to the ultraviolet and/or visible light sensitive photopolymerizable initiator.

8. A dry film resist whose main component is a composition according to claim 1.

9. A dry film resist according to claim 8, wherein the ultraviolet and/or visible light sensitive photopolymerizable initiator is a photopolymerizable initiator with photosensitivity to light of 478, 488 or 532 nm.

* * * * *